United States Patent [19]

Hood, Jr.

[11] 4,333,023

[45] Jun. 1, 1982

[54] TEMPERATURE-STABILIZED LOGARITHMIC CONVERTER

[75] Inventor: Rush W. Hood, Jr., Beaverton, Oreg.

[73] Assignee: Tektronix, Inc., Beaverton, Oreg.

[21] Appl. No.: 159,989

[22] Filed: Jun. 16, 1980

[51] Int. Cl.[3] .......................... H03K 3/26; G06G 7/24

[52] U.S. Cl. .................................... 307/310; 307/491; 307/492; 328/145

[58] Field of Search ......................... 307/491, 492, 310; 328/145

[56] References Cited

U.S. PATENT DOCUMENTS

| | | | |
|---|---|---|---|
| 3,308,271 | 3/1967 | Hilbiber | 307/310 |
| 3,393,870 | 7/1968 | Jeffrey | 307/310 |
| 3,703,651 | 11/1972 | Blowers | 307/310 |
| 4,232,233 | 11/1980 | Clouser et al. | 307/492 |

*Primary Examiner*—Stanley D. Miller, Jr.

*Assistant Examiner*—B. P. Davis

*Attorney, Agent, or Firm*—George T. Noe

[57] ABSTRACT

A logarithmic converter circuit comprising an emitter-coupled pair of transistors and a pair of operational amplifiers is provided with a temperature-stabilized environment so that accurate logarithmic conversion is facilitated. One of the pair of transistors is utilized as a temperature sensor to provide a temperature control voltage, which in turn controls the power applied to a heating element disposed adjacent the pair of transistors to maintain a constant semiconductor junction temperature. The heating element may suitably be one or more transistors disposed proximate the pair of transistors on a common substrate. The absolute temperature of the sensor transistor base-to-emitter junction is established by the use of precise gain-setting components, and by adjusting the temperature reference voltage for the correct system gain.

5 Claims, 1 Drawing Figure

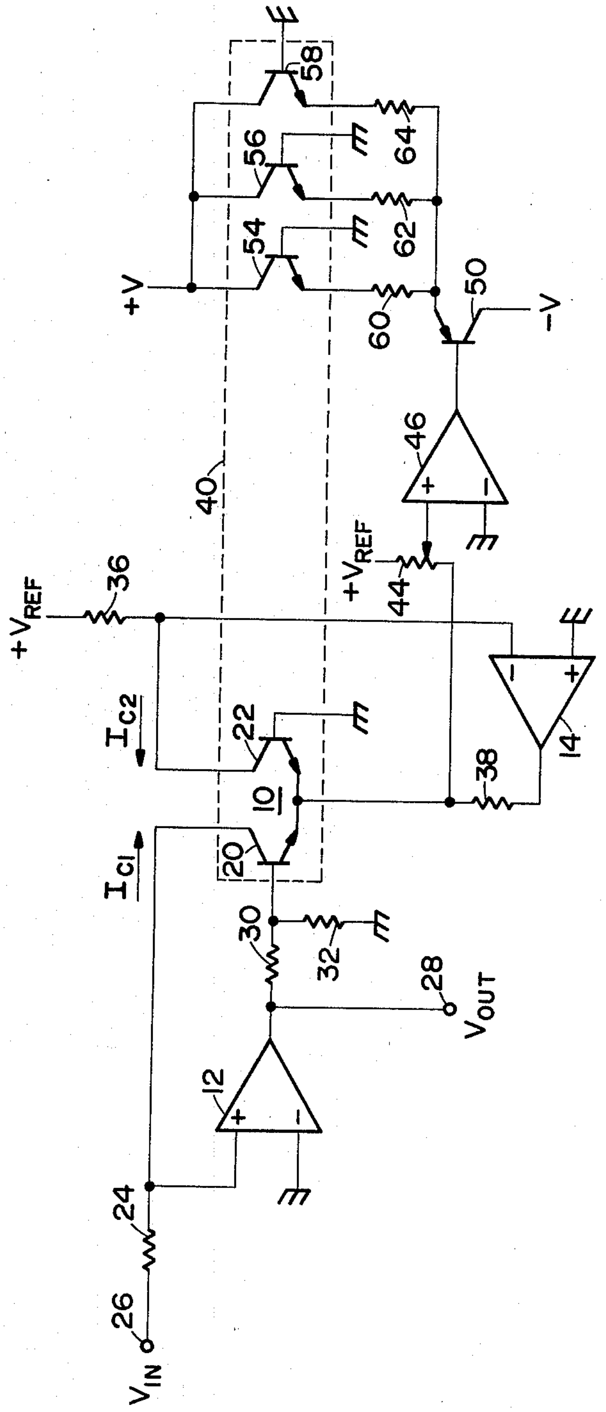
58
56
54
64
62
60
50
+V
−V
46
40
$+V_{REF}$
36
$+V_{REF}$
44
$I_{C2}$
22
10
20
$I_{C1}$
14
38
30
32
28
$V_{OUT}$
12
24
26
$V_{IN}$

TEMPERATURE-STABILIZED LOGARITHMIC CONVERTER

BACKGROUND OF THE INVENTION

Logarithmic converter circuits produce a DC output voltage in a logarithmic relationship to DC input voltages and are used in a variety of applications in electronic measurement equipment, including log scaling of display axes and log compression of DC voltage ranges. The typical prior art circuit includes a differential amplifier in which one transistor is the logging transistor and the other transistor provides a fixed offset for temperature. A pair of operational amplifiers are cascaded in overall feedback loop to improve stability for logarithmic conversion of an input signal. Log converters utilize the logarithmic voltage-current characteristic of a semiconductor junction; however, this characteristic is very dependent upon the temperature of the junction. This so-called temperature coefficient of gain causes such log converters to be accurate at zero decibels (dB) but inaccurate at other input levels when the junction temperature changes from that at which the converter was calibrated. The typical method for providing temperature compensation or temperature control is to employ either a thermistor or an externally-sensed oven.

SUMMARY OF THE INVENTION

The present invention relates generally to logarithmic converter circuits, and in particular to a temperature-stabilized logarithmic converter circuit.

In accordance with the present invention, a logarithmic converter circuit of conventional design comprising a differential amplifier and a pair of operational amplifiers is provided with a temperature-stabilized environment so that accurate logarithmic conversion is facilitated. The base-emitter junction of one of the transistors in the differential amplifier pair is utilized as a temperature sensor, taking advantage of the volt-equivalent of temperature phenomena of the junction to provide a temperature control voltage which in turn controls the power applied to a heating element to maintain a constant semiconductor junction temperature. In a proposed commercial embodiment, the differential amplifier transistors are provided in a monolithic integrated circuit, and the heating element may suitably be one or more transistors located adjacent to the differential amplifier transistors. A temperature control amplifier is disposed between the common emitters of the differential amplifier transistors and the heating element transistors to vary the power applied to the heating transistors to maintain a constant junction temperature. With the junction temperature held constant, the errors caused by varying ambient temperatures are effectively cancelled. The absolute temperature is established by the use of precise gain-setting components, and by adjusting the temperature reference voltage for the correct system gain.

It is therefore one object of the present invention to provide a logarithmic converter with a novel temperature control system.

It is another object of the present invention to provide a temperature-stabilized logarithmic converter circuit which is insensitive to ambient temperature changes over a wide temperature range.

It is a further object of the present invention to provide a temperature-stabilized logarithmic converter circuit in which the temperature sensor is an integral part of the logging circuit.

Other objects and advantages will become apparent to those having ordinary skill in the art upon a reading of the following description when taken in conjunction with the accompanying drawing.

BRIEF DESCRIPTION OF THE DRAWING

The single FIGURE is a schematic diagram of the preferred embodiment in accordance with the present invention.

DETAILED DESCRIPTION OF THE PREFERRED EMBODIMENT

In the single FIGURE, a temperature-stabilized logarithmic converter is shown in which a logarithmic converter circuit comprises a differential amplifier 10, a first operational amplifier 12, a second operational amplifier 14, and associated impedance elements. Differential amplifier 10 comprises an emitter-coupled pair of transistors 20 and 22. The collector of transistor 20 is connected to the non-inverting (+) input of operational amplifier 12, and via a resistor 24 to an input terminal 26. The inverting input (−) of operational amplifier 12 is connected to ground potential, while the output thereof is connected to an output terminal 28, and also coupled via a voltage divider comprising resistors 30 and 32 to the base of transistor 20.

The base of transistor 22 is connected to ground potential, and the collector thereof is connected via a resistor 36 to a suitable source of positive reference voltage, $+V_{REF}$. The collector of transistor 22 is also connected to the inverting input of operational amplifier 14. The non-inverting input of operational amplifier 14 is connected to ground potential, while the output thereof is coupled via a resistor 38 to the common emitters of transistors 20 and 22.

The logarithmic converter circuit described so far is of substantially conventional design. Operational amplifier 12 includes transistor 20, operated common emitter, as part of its feedback loop, and through operational amplifier action, maintains the collector of transistor 20 at zero volts. Operational amplifier 14 includes transistor 22, operated common base, as part of its feedback loop, and through operational amplifier action, maintains the collector of transistor 22 at zero volts. The output voltage is expressed by:

$$V_{OUT} = \left(1 + \frac{R_{30}}{R_{32}}\right)\left(\frac{kT}{q}\right)\ln\left(\frac{I_{C1}}{I_{C2}}\right), \quad (1)$$

where k is Boltzmann's constant, T is absolute temperature, and q represents the charge on an electron. With the collectors of transistors 20 and 22 held at zero volts, the respective collector currents may be expressed as $I_{C1}=V_{IN}/R_{24}$ and $I_{C2}=V_{REF}/R_{36}$. The values of resistors 24 and 36 are selected to provide the desired magnitude of collector currents $I_{C1}$ and $I_{C2}$, and to provide equal collector currents $I_{C1}$ and $I_{C2}$ at the zero decibel input voltage. The scale factor of $V_{OUT}$ in volts per decibel is established by the selected values of resistors 30 and 32 at a constant junction temperature T of transistors 20 and 22. Under these conditions, and with k, q, and T constant, the transfer function of the logarithmic converter circuit is expressed by:

$$V_{OUT}=20 \log (V_{IN}/V_{REF.}) \quad (2)$$

To hold the junction temperature T constant, a heating element and temperature control circuit are provided. The differential amplifier transistors 20 and 22 are provided in a monolithic integrated circuit indicated generally by a dash line 40. Since both the collector and base voltages of transistor 22 are held at zero volts and ground potential respectively, and the collector current $I_{C2}$ is held constant, any changes in base-to-emitter voltage must be due to changes in absolute temperature T, whereby the absolute value of the base-to-emitter voltage is inversely proportional to the absolute temperature T. Therefore, transistor 22 may be also used as a temperature sensor, and the emitter voltage thereof utilized as a temperature control signal. The temperature control signal, which is slightly negative with respect to ground because of the base-to-emitter voltage drop, is applied to one end of a potentiometer 44. The other end of potentiometer 44 is connected to a suitable reference voltage source, $+V_{REF.}$ The wiper arm of the potentiometer is connected to the non-inverting input of a temperature control amplifier 46, which is a monolithic differential amplifier operated in a linear fashion. The output of amplifier 46 is connected to the base of a current sink transistor 50, which sinks the current at the collector thereof to a suitable source of negative supply voltage, $-V$. Three heating element transistors 54, 56, and 58 are located within the integrated circuit adjacent the differential amplifier transistors 20 and 22 and thermally connected to them. The bases of the heating element transistors 54, 56, and 58 are connected to ground, while the collectors thereof are connected to a suitable source of positive supply voltage, $+V$. Resistors 60, 62, and 64 are connected between the respective emitters of transistors 54, 56, and 58 and the emitter of transistor 50 to establish the heater current.

To maintain a stable and controllable junction temperature, the temperature of the semiconductor substrate of integrated circuit 40 must be heated above the ambient temperature. Care should be taken to see that the substrate temperature is not chosen to be so high that the semiconductor devices will be damaged or that the heater transistors will have insufficient power to maintain the desired temperature. For the preferred embodiment described herein, a junction temperature of 70 degrees Celsius was chosen. Using T=70° C.+273°=343° K., Equation (1) above is utilized to determine the scale factor for a desired gain, e.g., −20 decibels. Gain-setting resistors 30 and 32 are selected to provide the correct scale factor. In operation, the system is calibrated by adjustment of resistor 44. Since the system gain will be correct only when the absolute temperature T is at the predetermined value, the relationship of which is dictated by Equation (1), resistor 44 is adjusted until the system gain is correct. Thus, the temperature T may be established without direct temperature measurement. With the junction temperature of transistors 20 and 22 held constant, the errors caused by varying ambient temperatures are effectively cancelled.

While I have shown and described a preferred embodiment of my invention, it will be apparent to those skilled in the art that many changes may be made without departing from my invention in its broader aspects. The appended claims therefore cover all such changes and modifications as fall therewithin.

What I claim as being novel is:

1. A temperature-stabilized logarithmic converter circuit, comprising:
   - an emitter coupled pair of transistors;
   - first and second operational amplifiers operatively associated with said pair of transistors in such a manner that at least a portion of each transistor forms part of the feedback loop for a respective operational amplifier, whereby a voltage at the output of said first operational amplifier is logarithmically related to a voltage at the input thereof;
   - means for heating said pair of transistors to a temperature higher than ambient;
   - means for sensing a change in the junction temperature of one of said pair of transistors; and
   - heater control means responsive to said sensing means for controlling the power applied to said heating means.

2. A circuit in accordance with claim 1 wherein said heating means comprises at least one transistor disposed adjacent said pair of transistors.

3. A circuit in accordance with claim 2 wherein said pair of transistors and said heating transistor share a common substrate.

4. A circuit in accordance with claim 1 wherein said sensing means comprises means for operating said one of said pair of transistors at a constant current and constant collector and base voltages, and means for comparing the emitter voltage thereof with a reference voltage.

5. A circuit in accordance with claim 1 wherein said heater control means comprises an amplifier responsive to said sensing means, and a variable current source responsive to said amplifier.

* * * * *